United States Patent [19]

Iijima et al.

[11] Patent Number: 5,963,410
[45] Date of Patent: Oct. 5, 1999

[54] INSULATION TESTING METHOD AND APPARATUS THEREFOR

[75] Inventors: Yasuo Iijima; Masahiro Tsubokawa, both of Takefu, Japan

[73] Assignee: Matsushita Electric Industrial Co., Ltd., Japan

[21] Appl. No.: 08/691,672

[22] Filed: Aug. 2, 1996

[30] Foreign Application Priority Data

Aug. 2, 1995 [JP] Japan ..................................... 7-197353

[51] Int. Cl.⁶ .......................................................... H02H 3/00
[52] U.S. Cl. ............................................. 361/88; 324/551
[58] Field of Search .................................. 361/88, 86, 91, 361/92; 324/546, 551

[56] References Cited

U.S. PATENT DOCUMENTS 3,515,986  6/1970  Peschel ..................................... 324/544
5,514,967  5/1996  Zelm ........................................ 324/551

FOREIGN PATENT DOCUMENTS 62-180282  8/1987  Japan .

*Primary Examiner*—Sally C. Medley
*Attorney, Agent, or Firm*—Rossi & Associates

[57] ABSTRACT

A voltage value of an impulse voltage repetitively applied on a test-piece coil is increased in accordance with time elapse. A terminal voltage applied on both ends of the test-piece coil is monitored to detect an electric breakdown of the test-piece coil. Upon detecting such a breakdown, application of the impulse voltage is immediately stopped to prevent the test-piece coil from being unnecessarily damaged. Meanwhile, a voltage value of the impulse voltage is measured quantitatively at the time the electric breakdown is detected and the measured data is stored in a memory, so that the memorized data can be used later as a breakdown voltage value.

5 Claims, 4 Drawing Sheets

INSULATION TESTING METHOD AND APPARATUS THEREFOR

BACKGROUND OF THE INVENTION

1. Field of the Invention

This invention generally relates to a method and an apparatus for testing the insulation condition of a winding portion in an electric device, such as a compact motor or a transformer.

2. Prior Art

In general, the life of a compact motor or a transformer may be fatally shortened due to electric breakdown in its coil when they are in operation. This kind of electric breakdown will be, for example, caused due to the damage of insulating sheath covering a magnet wire of the coil, since such a damage possibly causes a local breakdown (so-called "layer short-circuit") between the magnet wires having different electric potentials. Furthermore, if an insulating sheet interposed between the coil and its iron core is damaged, similar breakdown (so-called "grounded short-circuit") will be caused and an extraordinary current may flow.

An impulse-voltage testing method is a representative method conventionally well-known and used for testing this kind of insulation condition.

Hereinafter, one conventional impulse-voltage testing method will be explained. FIG. 3 is a circuit diagram showing the conventional impulse-voltage testing apparatus. As shown in FIG. 3, a testing apparatus comprises an impulse-voltage generating unit 1 for generating an impulse voltage used for the insulation test, a changeover switch 2 for switching the polarity of the impulse voltage, a measured body 3 consisting of a test-piece coil 30 and a standard (or reference) coil 32 connected in series each other, and an oscilloscope 4 for monitoring the waveform of a connecting point between test-piece coil 30 and standard coil 32.

Impulse-voltage generating unit 1 comprises a commercial power source unit 11 whose output voltage is adjusted by a voltage adjuster 12 so that a step-up transformer 13 connected to this voltage adjuster 12 can generate a predetermined output voltage in a range of 0 to 3000 V. The boosted output of step-up transformer 13 is applied a half-wave rectification through a diode 14, and is stored in a capacitor 15 as a high tension DC voltage. An impulse trigger generating circuit 18 generates a trigger pulse during a dormant period of the half-wave rectification of diode 14 during which no charge is stored in capacitor 15. An SCR 16 is activated in response to the trigger pulse generated from impulse trigger generating circuit 18, thereby outputting an impulse voltage from the impulse-voltage generating unit 1. A resistance 17 is provided to stabilize the operation of SCR 16.

The impulse voltage, generated from the impulse-voltage generating unit 1 in this manner and having the waveform shown in FIG. 4, is then supplied to the changeover switch 2 to alternately switch the polarity of the impulse voltage, and is finally applied to the measured body 3.

As described above, the measured body 3 comprises a pair of test-piece coil 30 and standard coil 32 connected in series. Oscilloscope 4 is connected to the joint point between test-piece coil 30 and standard coil 32. An iron core 31 of test-piece coil 30 and an iron core 33 of standard coil 32 are grounded respectively.

After passing through changeover switch 2, the impulse voltage first flows across test-piece coil 30 and subsequently flows across standard coil 32, and is then extinguished into earth. In this moment, oscilloscope 4 displays the waveform of a transient voltage appearing between the terminal ends of standard coil 32.

Next, changeover switch 2 is turned over. This time, the impulse voltage first flows across standard coil 32 and subsequently flows across test-piece coil 30 and is then extinguished into earth. In this moment, oscilloscope 4 displays the waveform of a transient voltage appearing between the terminal ends of test-piece coil 30. As a result, the above-described two waveforms of transient voltages of both test-piece coil 30 and standard coil 32 are displayed in an overlapped manner on the screen of oscilloscope 4.

The transient-voltage waveform of test-piece coil 30 is basically identical with the transient-voltage waveform of standard coil 32, unless test-piece coil 30 is defective. In other words, only one waveform is displayed on the screen of oscilloscope 4.

On the other hand, in the event that test-piece coil 30 causes the grounded short-circuit or layer short-circuit, the transient-voltage waveform of test-piece coil 30 is explicitly differentiated from the transient-voltage waveform of standard coil 32. Accordingly, two different waveforms are displayed on the screen of oscilloscope 4. Thus, it becomes possible to detect the presence of the ground short-circuit or layer short-circuit in the test-piece coil 30.

However, according to the above-described conventional testing apparatus, the impulse voltage is set to a predetermined constant value in advance to make a judgement as to whether or not the test-piece coil is durable against this setting voltage. For example, when the impulse voltage is set to 2000 V, a test-piece coil will be acceptable if it is durable against 2000 V, or non-acceptable if it causes the grounded short-circuit or layer short-circuit. In short, this conventional testing apparatus is only effective to judge the acceptability of each test-piece coil, and is useless in detecting a threshold impulse voltage at the level of which the electric breakdown is actually caused.

In view of the stress imparted on the test-piece coil, it is generally desirable to suppress the magnitude of the impulse voltage as small as possible. For example, there will be a need for detecting a repairable damage through this test to return the test-piece coil to the manufacturing line. In such a case, it will be strictly prohibited to apply an unnecessarily large impulse voltage on this test-piece coil.

SUMMARY OF THE INVENTION

Accordingly, in view of above-described problems encountered in the prior art, a principal object of the present invention is to provide a novel and excellent insulation testing method and apparatus capable of measuring a breakdown voltage of each test-piece coil as a quantitative value without causing damage on the test-piece coil.

In order to accomplish this and other related objects, a first aspect of the present invention provides an insulation testing method comprising steps of: increasing a voltage value of an impulse voltage repetitively applied on a test-piece coil in accordance with time elapse; monitoring a terminal voltage applied on both ends of the test-piece coil to detect an electric breakdown of the test-piece coil; and immediately stopping application of the impulse voltage to the test-piece coil when any electric breakdown is detected.

According to the features of a preferred embodiment, a voltage value of the impulse voltage is measured at the time the electric breakdown is detected and stored in a memory, so that the memorized data can be used later as a breakdown voltage value.

Furthermore, a second aspect of the present invention provides an insulation testing apparatus comprising: a DC-voltage power source for generating an output voltage whose value increases up to a predetermined voltage in accordance with time elapse; an impulse voltage generating means for receiving the output voltage from the DC-voltage power source and generating a high tension impulse voltage; a failure detecting means for detecting any electric breakdown of a test-piece coil and generating a failure signal; and a means for deactivating the impulse voltage generating means in response to the failure signal and measuring a voltage value of the impulse voltage at the time the electric breakdown is detected.

With this arrangement, the impulse voltage applied to the test-piece coil is gradually increased from 0 or a sufficiently small value in accordance with time elapse. And, the application of the impulse voltage is immediately stopped when any electric breakdown is detected. Thus, it becomes possible to eliminate the possibility that the test-piece coil is unnecessarily damaged. Furthermore, it become possible to know a quantitative value of the impulse voltage at the time the electric breakdown is detected. Hence, the quantitative measurement of the breakdown voltage can be realized.

BRIEF DESCRIPTION OF THE DRAWINGS

The above and other objects, features and advantages of the present invention will become more apparent from the following detailed description which is to be read in conjunction with the accompanying drawings, in which.

DETAILED DESCRIPTION OF THE PREFERRED EMBODIMENT

Hereinafter, a preferred embodiment of the present invention will be explained with reference to the accompanying drawing.

Figure 1:
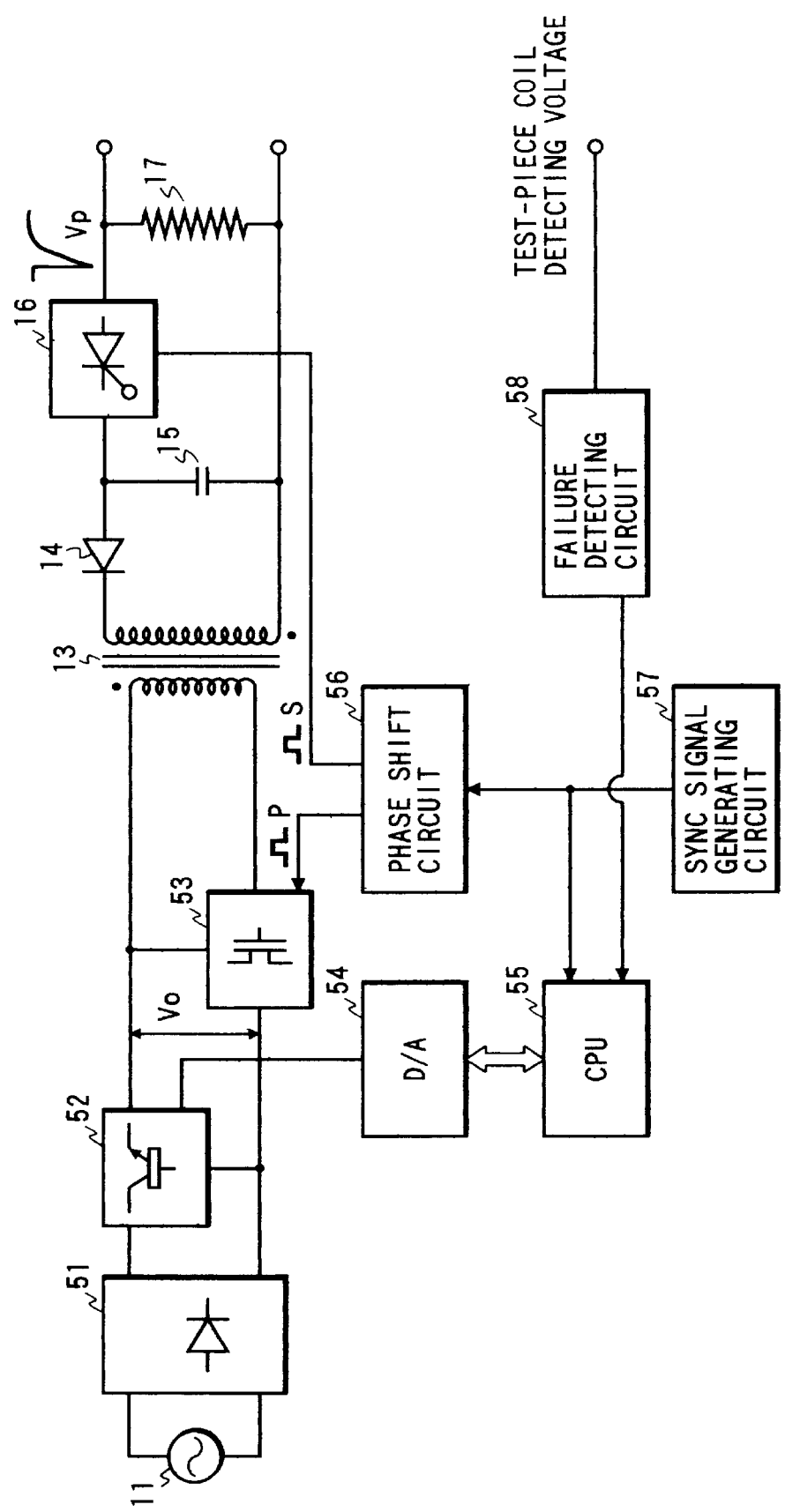
FIG. 1 is a schematic block diagram showing an arrangement of an impulse voltage generating apparatus in accordance with a preferred embodiment of the present invention.
Figure 2:
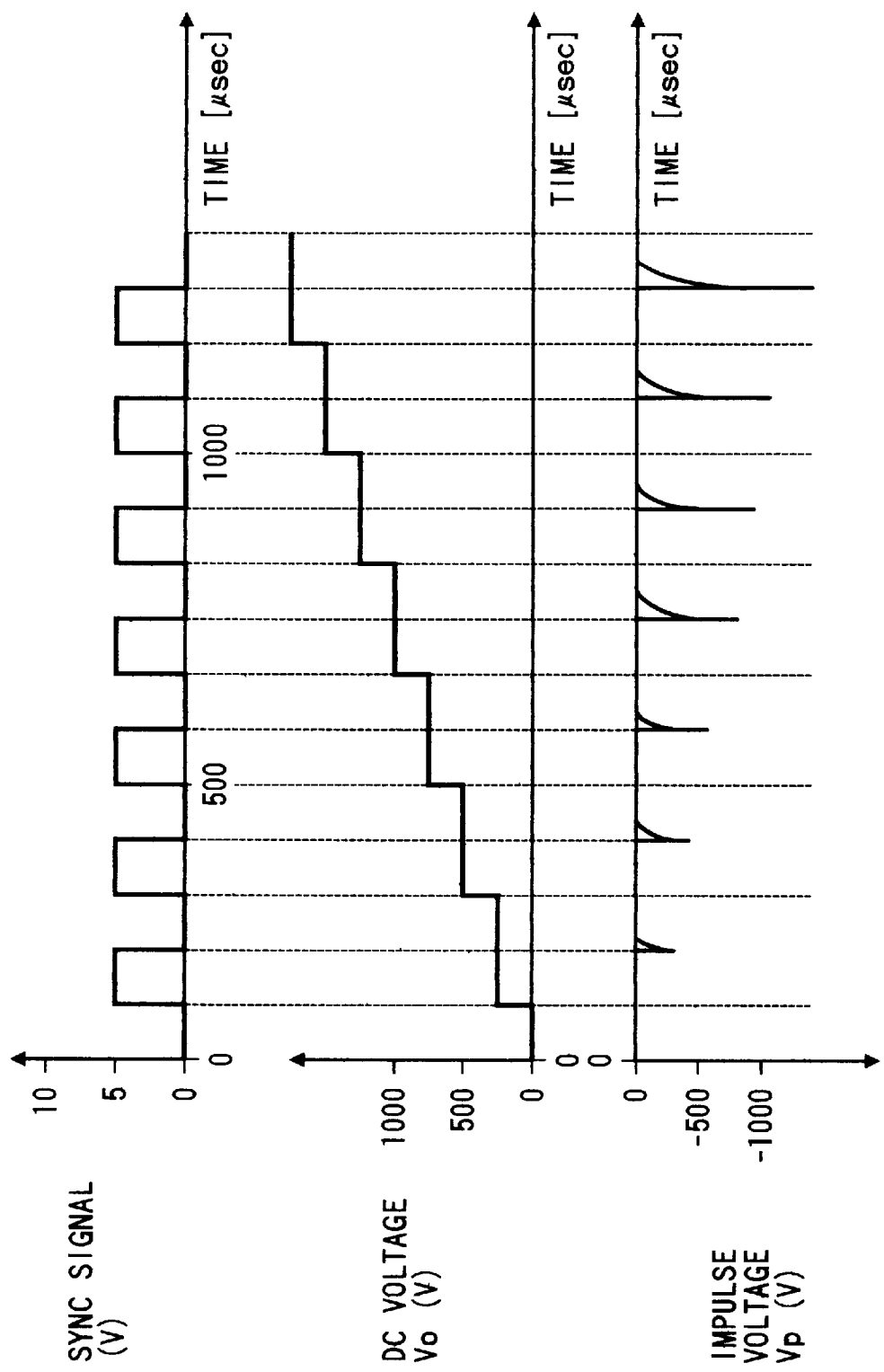
FIG. 2 is a time chart showing the operation of the impulse voltage generating apparatus shown in FIG. 1.

FIG. 1 is a schematic block diagram showing an arrangement of an impulse voltage generating apparatus in accordance with the preferred embodiment of the present invention. FIG. 2 is a time chart showing the relation between impulse voltage Vp and DC voltage Vo in relation to a given sync signal.

In FIG. 1, a commercial power source unit 11 generates an AC voltage. A rectification circuit 51 converts this AC voltage into a DC voltage. A voltage control circuit 52 has a function of increasing the DC voltage, when generated from rectification circuit 51, from 0 V to a predetermined voltage in accordance with time elapse. In this embodiment, the voltage control circuit 52 is a series regulator using a power transistor. A switching device 53, which is a power MOSFET in this embodiment, converts the DC voltage generated from voltage control circuit 52 into a pulse voltage through chopping. A step-up transformer 13 has a function of boosting the pulse voltage of switching device 53. A diode 14 converts the boosted voltage of step-up transformer 13 into a high tension DC voltage. A capacitor 15 is charged by the high tension DC voltage rectified through diode 14. An SCR 16 is activated in response to a trigger signal, and applies a voltage stored in capacitor 15 to a test-piece coil as an impulse voltage. A resistance 17 is provided to stabilize the operation of SCR 16.

Figure 3:
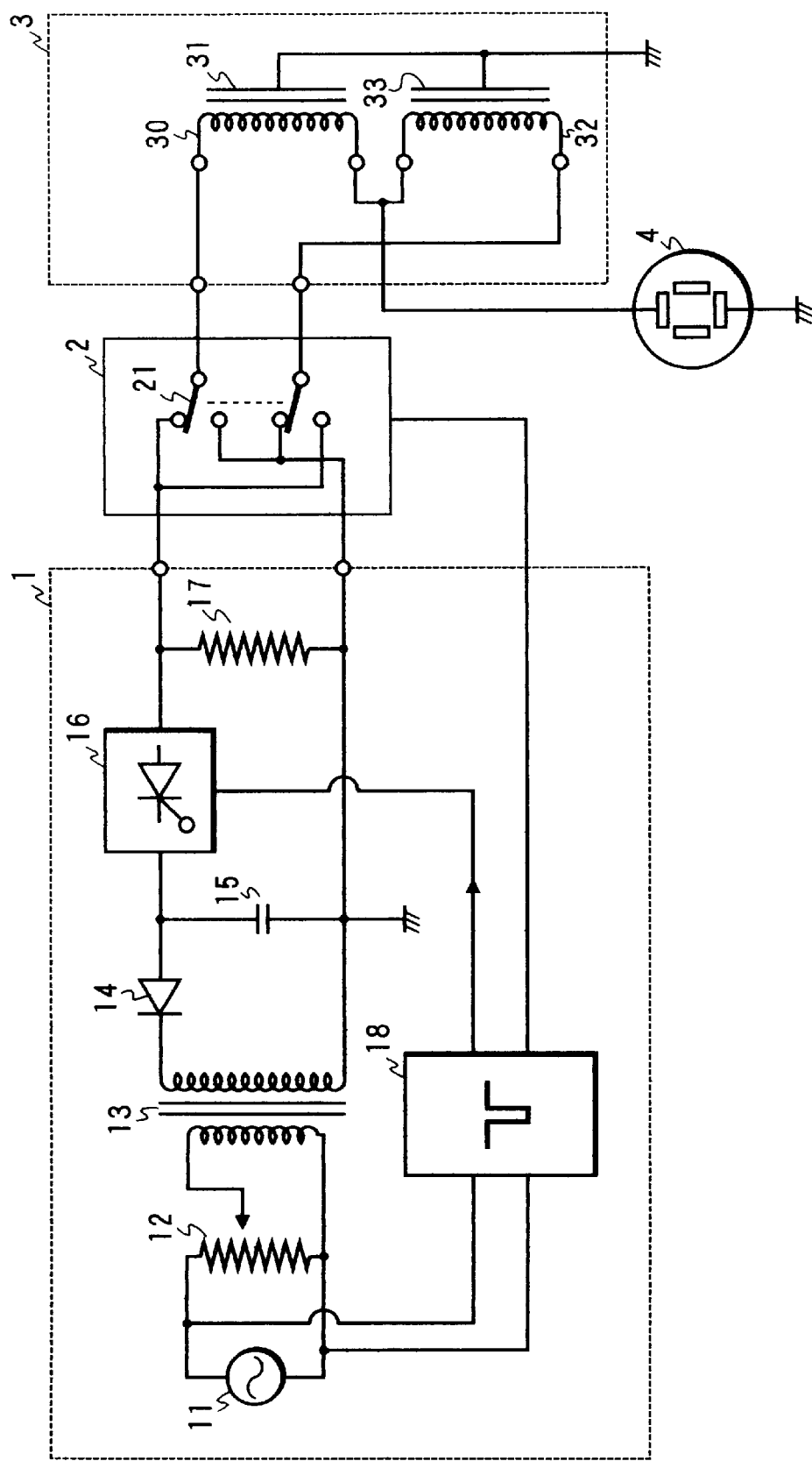
FIG. 3 is a circuit diagram showing a conventional impulse-voltage testing apparatus.
Figure 4:
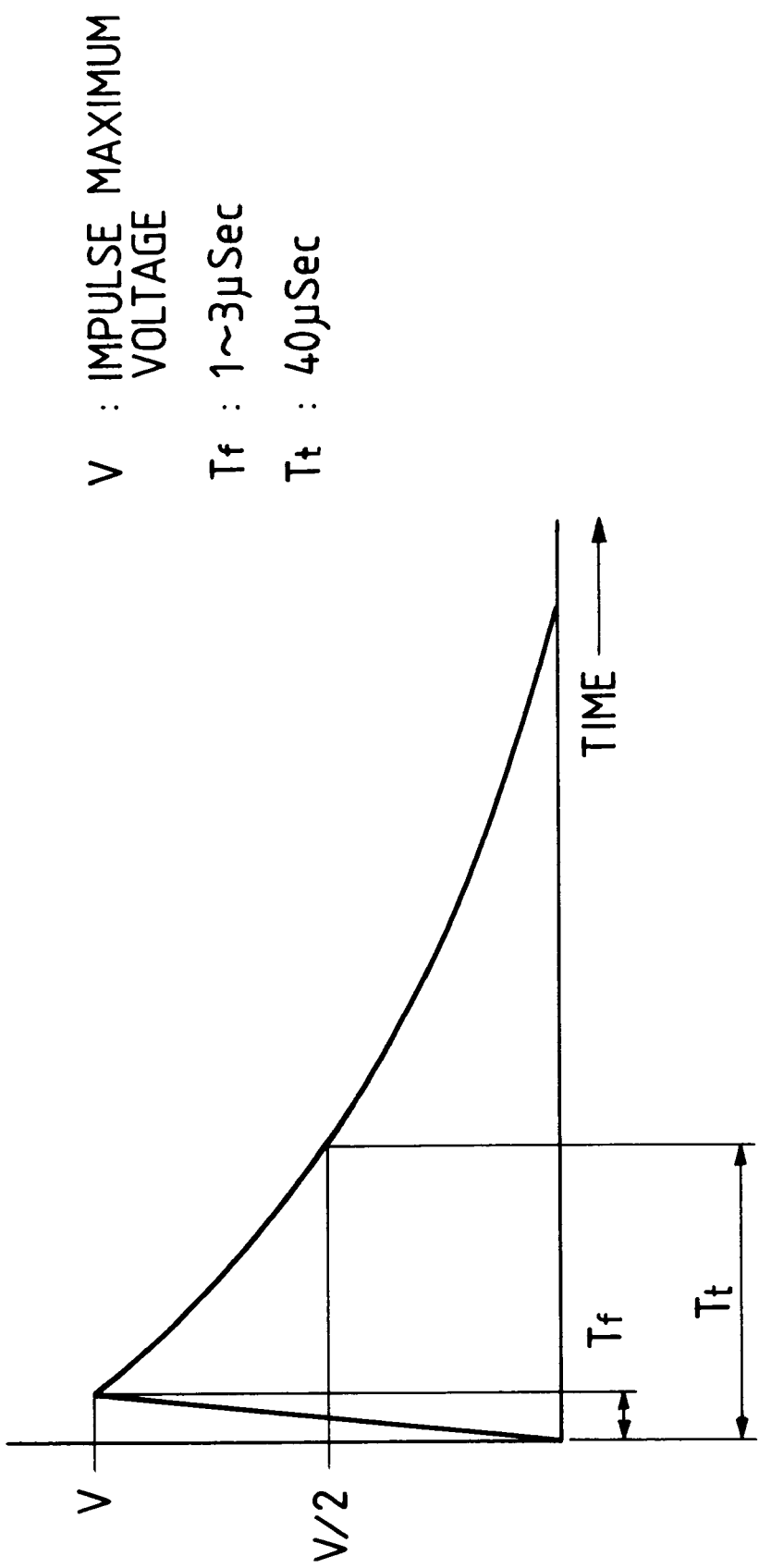
FIG. 4 is a graph showing a waveform of a representative impulse voltage.

A failure detecting circuit 58 monitors a terminal voltage appearing between the both ends of a test-piece coil (not shown), detects the change of a transient-voltage waveform to be caused when the electric breakdown happens, and generates a failure signal. In short, this embodiment no longer require a serial joint of the test-piece coil and the standard coil which was necessarily provided in the conventional test apparatus as explained with reference to FIG. 3, because the presence of electric breakdown can be detected by the monitoring of the transient-voltage waveform of the test-piece coil.

A sync signal generating circuit 57 has a function of synchronously driving switching device 53 and SCR 16. The sync signal, once generated from sync signal generating circuit 57, is supplied to a micro computer 55 and a phase shift circuit 56. In response to this sync signal, phase shift circuit 56 generates two kinds of pulse signals having a mutual phase difference of 180° which are sent to switching device 53 and SCR 16, respectively.

Micro computer 55 generates a voltage-control-command signal which is used to control the voltage control circuit 52 in such a manner that the DC voltage generated from rectification circuit 51 increases in accordance with time elapse. Meanwhile, micro computer 55 receives the failure signal when failure detecting circuit 58 generates this failure signal, and generates a cutdown-command signal in response to this failure signal for immediately reducing the output voltage Vo of voltage control circuit 52 to 0 V. Furthermore, micro computer 55 calculates the impulse voltage applied to the test-piece coil based on the voltage-control-command signal generated when the failure signal is received, and then generates the calculated value as a breakdown voltage value which is used later as a reference data.

D/A conversion circuit 54 has a function of converting a digital signal supplied from micro computer 55, i.e. the voltage-control-command signal, to an analog signal which is supplied to voltage control circuit 52.

An operation of the above-described impulse voltage generating apparatus will be explained hereinafter. First of all, rectification circuit 51 rectifies the output of commercial power source unit 11 and generates a DC voltage. This DC voltage is entered into voltage control circuit 52 which is controlled by micro computer 55 through D/A conversion circuit 54. Voltage control circuit 52 generates the voltage Vo increasing from 0 V to the predetermined voltage in a stepwise fashion in accordance with time elapse.

The output voltage Vo of voltage control circuit 52 is chopped by switching device 53 and converted into the pulse voltage which is boosted by step-up transformer 13. The boosted pulse voltage, thus generated from step-up transformer 13, is converted into the high tension DC voltage through the half-wave rectification of diode 14. Capacitor 15 is charged when it receives this high tension DC voltage.

SCR 16 is activated by the pulse signal having a phase different 180° compared with the pulse signal supplied to switching device 53. Hence, SCR 16 is active only when switching device 53 is deactivated, and starts its operation in response to the trigger signal in the beginning of the dormant period of the half-wave rectification by diode 14. Accordingly, capacitor 15 is charged during the half-wave rectification, and is discharged during the dormant period of this half-wave rectification. Through this repetitive charging and discharging operation, the test-piece coil is subjected to a repetitive impulse voltage Vp whose peak voltage is proportional to DC voltage Vo and therefore increases from 0 V to the predetermined voltage in accordance with time elapse.

FIG. 2 shows the relationship between the stepwise-ascending DC voltage Vo and the generated impulse voltage Vp in relation to the sync signal.

On the other hand, failure detecting circuit 58 continuously monitors the waveform of the transient voltage appearing between terminal ends of the test-piece coil, and has a memory memorizing the transient-voltage waveform when the impulse voltage is low (e.g. 500 V) enough to prevent the electric breakdown even if the coil has a damage.

By gradually increasing the impulse voltage Vp, the transient-voltage waveform of the test-piece coil is detected every time the impulse voltage Vp is applied to the test-piece coil. The detected waveform is compared with the referential transient-voltage waveform stored in the memory. When the impulse voltage Vp is still smaller than the predetermined value, the transient-voltage waveform remains unchanged unless the test-piece coil is defective. Hence, no failure signal is generated and the test-piece coil will be judged as non-defective as a result of the measurement.

However, if the test-piece coil has a damage, the electric breakdown will be caused at a relatively smaller impulse voltage Vp and a resultant transient-voltage waveform will be apparently different from the referential transient-voltage waveform stored in the memory. Hence, failure detecting circuit 58 identifies the presence of failure and generates the failure signal.

Upon receiving this failure signal, micro computer 55 immediately sends the voltage-control-command signal to voltage control circuit 52 to reduce the output voltage Vo to 0 V. At the same time, micro computer 55 calculates the impulse voltage value applied to the test-piece coil based on the voltage-control-command signal generated when the failure signal is received, and then generates the calculated value as the breakdown voltage value.

As apparent from the foregoing description, according to the present embodiment, the impulse voltage Vp applied to the test-piece coil is successively increased from 0 V in accordance with time elapse. And, the application of impulse voltage Vp is immediately stopped when any electric breakdown is detected. Thus, it becomes possible to eliminate the possibility that the test-piece coil is unnecessarily damaged. When the damage of the test-piece coil is a repairable one, this testing method prevents this test-piece coil from being further damaged through execution of this test and assures that the test-piece coil can be repaired even after finishing the test. Furthermore, the voltage-control-command signal of the micro computer is used to calculate the impulse voltage value at the time the electric breakdown is detected. Hence, the breakdown voltage value can be quantitatively measured.

Although the above-described embodiment uses the DC voltage Vo increasing from 0 V, it is of course possible to change the minimum level of DC voltage Vo to a certain value greater than 0 but still small enough so that the total measurement time can be shortened. Although the impulse voltage Vp increases in a stepwise fashion, it will be possible to finely set the steps so as to virtually realize a continuous change of impulse voltage Vp.

Furthermore, although the above-described embodiment calculates the impulse voltage value based on the voltage-control-command signal of the micro computer, the impulse voltage will be readable indirectly from the transient voltage appearing between the terminal ends of the test-piece coil which is monitored by the failure detecting circuit. Furthermore, it is possible to calculate the impulse voltage value by reading DC voltage Vo.

As this invention may be embodied in several forms without departing from the spirit of essential characteristics thereof, the present embodiment described is therefore intended to be only illustrative and not restrictive, since the scope of the invention is defined by the appended claims rather than by the description preceding them, and all changes that fall within metes and bounds of the claims, or equivalents of such metes and bounds, are therefore intended to be embraced by the claims.

What is claimed is:

1. An insulation testing apparatus comprising:

a DC-voltage power source for generating an output voltage whose value increases up to a predetermined voltage in accordance with elapsed time;

on imputs voltage generating means for receiving said output voltage from said DC-voltage power source and generating a series of impulse voltage signals, wherein a voltage value of each successive impulse voltage signal in the series is increased;

a failure detecting means for detecting any electric breakdown of a test-piece coil to which the series of impulse voltage signals is applied and generating a failure signal; and a means for deactivating said impulse voltage generating means in response to said failure signal and measuring a voltage value of an impulse voltage signal from the series of impulse voltage signals that was applied to the test-piece coil at the time said electric breakdown is detected.

2. An insulation testing method comprising steps of:

applying a series of impulse voltage signals to a test-piece, wherein a voltage value of each successive impulse voltage signal in the series is increased;

monitoring a terminal voltage of the test-piece as each of the impulse voltage signals is applied to the test-piece to detect an electric breakdown of said test-piece; and stopping application of the series of impulse voltages signals to the test-piece when an electric breakdown is detected.

3. An insulation testing method according to claim 2, wherein the voltage value of the impulse voltage signal applied to the test-piece when the electric breakdown is detected is stored in memory.

4. An impulse testing method comprising the steps of:

applying a series of impulse voltage signals to a test-piece through a capacitor that is repetitively charged and discharged to generate said series of impulse voltage signals, wherein a voltage value of each successive impulse voltage signal in the series is increased;

monitoring a terminal voltage of the test-piece as each of the impulse voltage signals is applied to the test-piece to detect an electric breakdown of said test-piece; and stopping application of the series of impulse voltage signals to the test-piece when an electric breakdown is detected.

5. A testing apparatus comprising:

a voltage generating means for generating an adjusted voltage;

a capacitor charged by the adjusted voltage of said voltage generating means;

a switching means for discharging said capacitor to give an impulse voltage signal to a test-piece;

means for applying a series of impulse voltage signals to said test-piece by repetitively charging and discharging said capacitor, wherein a voltage value of each successive impulse voltage signal in the series is increased by controlling said adjusted voltage;

failure detecting means for detecting any electric breakdown of said test-piece and generating a failure signal; and means for stopping application of said series of impulse voltage signals to said test-piece in response to said failure signal and measuring a voltage value of an impulse voltage signal from said series of impulse voltage signals that was applied to the test-piece at the time said electric breakdown is detected.

* * * * *